United States Patent

Hammond et al.

[11] Patent Number: 5,950,071
[45] Date of Patent: *Sep. 7, 1999

[54] DETACHMENT AND REMOVAL OF MICROSCOPIC SURFACE CONTAMINANTS USING A PULSED DETACH LIGHT

[75] Inventors: Peter M. Hammond, Rochester; Kevin J. Kearney, Fairport, both of N.Y.

[73] Assignee: Lightforce Technology, Inc., Rochester, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/559,920

[22] Filed: Nov. 17, 1995

[51] Int. Cl.$^6$ .................................................. H01L 21/48
[52] U.S. Cl. ........................... 438/115; 438/120; 438/906
[58] Field of Search ........................... 438/115, 129, 438/906, FOR 370; 134/1

[56] References Cited

U.S. PATENT DOCUMENTS

| | | | |
|---|---|---|---|
| 3,710,279 | 1/1973 | Ashkin | 331/94.5 |
| 3,778,612 | 12/1973 | Ashkin | 250/251 |
| 3,808,432 | 4/1974 | Ashkin | 250/251 |
| 3,808,550 | 4/1974 | Ashkin | 331/94.5 |
| 4,987,286 | 1/1991 | Allen | 219/121.68 |
| 5,023,424 | 6/1991 | Vaught | 219/121.6 |
| 5,151,135 | 9/1992 | Magee et al. | 134/1 |
| 5,373,806 | 12/1994 | Logar | 117/106 |
| 5,472,550 | 12/1995 | Periasamy | 156/345 |
| 5,516,369 | 5/1996 | Lur et al. | 134/1.3 |
| 5,531,862 | 7/1996 | Otsubo et al. | 156/643.1 |

*Primary Examiner*—David E. Graybill
*Attorney, Agent, or Firm*—Robert J. Bird

[57] ABSTRACT

A process for detachment and removal of microscopic contaminant particles from a surface includes a pulsed detach light directed at the surface to excite a contaminant particle thereon at or near its resonant frequency, to thereby detach the particle from the surface; and a photophoresis light directed at the particle to move it by photophoresis, to thereby prevent its reattachment to the surface. A thermal gradient may also be applied to control the velocity and direction of particle movement by thermophoresis. Detach light is of variable pulse frequency and angle of incidence.

7 Claims, 1 Drawing Sheet

DETACHMENT AND REMOVAL OF MICROSCOPIC SURFACE CONTAMINANTS USING A PULSED DETACH LIGHT

FIELD OF THE INVENTION

This invention relates to cleaning of substrates in manufacturing processes, and more particularly to a dry method for detaching and removing microscopic contaminant particles from such substrates.

BACKGROUND AND INFORMATION DISCLOSURE

Relevant literature, including the references noted parenthetically in the following discussion, are listed in an Appendix to this specification.

Trends in the manufacture of integrated circuits (IC), flat panel displays (FPD), and other related industries are driving the need for further advances in cleaning methods. Cleaning of product substrates is a critical part of the manufacturing process. Contamination remaining on the substrate may cause defects rendering the end product device useless. Contaminant particles can cause killer defects and lower production yield. And, with further advances in design and manufacturing processes, it is expected that sub-micron particles will have an even greater impact on production yield than they do today.

Present liquid-phase and vapor-phase cleaning methods are not entirely satisfactory in removing sub-micron particulates. Indeed, such methods are themselves a potential source of such contamination.

"Dry cleaning" techniques, i.e. cleaning without liquids or vapors, are called for by environmental concerns and by advances in manufacturing processes of all kinds. Dry cleaning technologies presently use plasmas and some vapor/gas phase techniques for vacuum process applications.

Silicon wafers have for some time been cleaned by high energy pulsed ruby lasers (emitting at 694.3 nm) and Nd:YAG lasers (1.06 micron). These relatively long wavelengths are not well absorbed by the silicon substrates, so higher laser power is required. This in turn can lead to undesirable effects such as substrate and particle melting. Also, coherence of the laser light creates interference effects and non-uniform beam profiles, with resulting hot spots and substrate surface damage.

Adhesion forces exist between particles and surfaces due to Van der Waals, electrostatic, and capillary attraction mechanisms. Van der Waals forces are due to interaction between an intrinsic dipole moment in one body and an induced dipole in a nearby body. Electrostatic forces are due to charge transfer and the subsequent formation of an electrostatic double layer repulsion between particle and substrate. Capillary forces arise when atmospheric moisture condenses in the gap between particle and substrate, and are a function of particle radius and liquid surface tension.

The mass (m) of a particle varies with the cube of its diameter, and the force (F) of its adhesion to a surface varies directly with its diameter. Hence, the acceleration (a=F/m) required to detach a particle from a surface varies inversely with the square of the diameter. As a result, adhesion forces on a micron-scale particle greatly exceed gravitational forces. One investigator (Tam) reports that the Van der Waals force on a 1 micron particle exceeds the weight of the particle by a factor of $10^7$. This greatly exceeds the forces characteristic of conventional cleaning methods. Another investigator (Bowling 1985) notes that the contact area of a particle on a surface is very small, and so the pressure on that particle-surface contact area is correspondingly very high. For a typical 1 micron particle, Bowling estimates a force per unit area of approximately $10^9$ dynes/cm$^2$, which is enough pressure to deform the particle. To the extent of such deformation, the contact area is increased, and the particle-to-surface adhesion strengthened.

Many substances absorb radiation strongly in the UV range, in short absorption path lengths. The development of UV lasers made it possible to irradiate a substrate so that only a thin surface layer is heated. This serves to concentrate the energy of the process where it is needed, at the particle-substrate interface region. This, in turn, relaxes laser energy requirements, and helps to minimize substrate surface damage.

Laser methods of particle desorption may be classified as being ablative or non-ablative. Ablation is an energetic phase transformation from solid to gas. At high enough laser intensities, a thin surface layer of substrate is removed, carrying surface contaminants away with it. As a cleaning method, this process is somewhat analogous to chemical etching because a thin surface layer of material is removed. Like chemical etching, laser ablation tends to micro-roughen the surface, making the process generally unsuitable for semiconductor or FPD cleaning applications.

Non-ablative particle removal methods rely on particle-substrate interactions excited by light to break the physical or chemical bonds holding the particle to the substrate. Non-ablative methods may be distinguished by whether or not an energy transfer medium is used to mediate the particle-substrate interaction. That is, they are subclassified as either direct exposure methods (no energy transfer medium) or energy transfer methods (with an energy transfer medium).

In a direct exposure method, a UV laser directly irradiates both particulate and surrounding substrate area (Magee 1991). Though it is not entirely understood, the method acts photochemically to break surface bonds (Engelsberg 1993 a,b,c) and to induce rapid thermal expansion of the particulate and/or a thin substrate layer to forcefully eject the particle from the surface (Kelley, Magee 1991).

In an energy transfer method, the substrate is coated with a layer of liquid energy transfer medium (Allen, Lee, Zapka). Radiation of the coated substrate causes the liquid layer to vaporize explosively, taking surface particulate with it.

Another recent development in laser cleaning, the "Radiance Process"™, is a surface cleaning process using deep ultraviolet (DUV) radiation and an inert gas flowing over the surface. Its theory of operation is that the application of DUV at a prescribed energy density initiates a localized photon/phonon interaction under the beam area. Applying photon radiation to the surface creates the cleaning phenomenon as long as the photon energy and density remain below the ablation threshold of the material. The Radiance Process is further disclosed in U.S. Pat. Nos. 5,024,968 and 5,099,557 to Engelsberg.

SUMMARY OF THE INVENTION

The object of this invention is to provide a system for detaching a particle from a surface by means of a modulated photon source to excite and vibrate the particle at or near the resonant frequency of the particle-surface system, then to move the particle away by photophoresis, gravity, or other means.

The present invention is a system for detachment and removal of microscopic contaminant particles from a surface. Pulsed "detach" light is directed at the surface to excite a contaminant particle thereon at or near its resonant frequency, to thereby detach the particle from the surface. Photophoresis light is directed at the particle to move it by photophoresis, to thereby prevent its reattachment to the surface. A thermal gradient may also be applied to control the velocity and direction of particle movement by thermophoresis. In a vacuum system, the particle will fall away from the surface by gravity. Detach light is of variable pulse frequency and angle of incidence.

DRAWING

DESCRIPTION OF PREFERRED EMBODIMENT(S)

Figure 1:
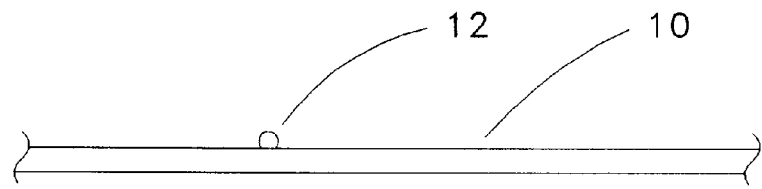
FIG. 1 represents a substrate with a single contaminant particle on it.

FIG. 1 represents a surface 10 with contaminant particles 12 upon it. Contaminant particles 12 are to be removed from the surface 10 by the system of this invention, which we call "resonance laser detachment".

Resonance laser detachment is the removal of a particle from a surface by use of "detach" light to excite and vibrate the particle at or near the particle-surface resonant frequency, to thereby detach the particle by breaking the particle-surface adhesion bonds; and "photophoresis" light to move the detached particle away from the surface to prevent its reattachment.

Detachment:

In general, particle-to-surface adhesion force (F) can be calculated as: $F = hr/8\pi z^2$ where (r) is particle radius in microns, (h) is Lifshitz-van der Waals constant (electron volts), and (z) is particle-surface separation in Ångstroms.

By Hooke's law: $F = -kz$ where (F) is force required to separate particle from surface, (z) is particle-surface separation, and (k) is the effective spring constant of the particle-surface system: $k = -F/z = hr/8\pi z^2/z = hr/8z^3$.

Considering the particle-surface system as a harmonic oscillator and knowing the separation distance (z) and the force (F) in dynes required to separate particle from surface, the resonant frequency ($f_0$) of the system can be calculated as: $f_0 = (1/2\pi)(k/m)^{1/2}$ where (m) is particle mass in grams, and (k) is the effective spring constant. Resonant frequencies on the order of 0.2 GHz to 2 GHz have been calculated for silicon particles adhering to silicon surfaces for sizes ranging from 0.10 microns to 10 microns in diameter.

Photophoresis:

Photophoresis is particle motion induced by light. It has two components:

(i) radiometric force due to uneven heating of the particle surface exposed to light, determined by the relationship: $F_{rm} = -2\pi d\eta^2 JKI/\rho TK_t$ where: (d) is particle diameter; ($\eta$) is ambient gas viscosity; (J) is asymmetry factor; (K) is coefficient of thermal slip; (I) is light source intensity in watts/area; ($\rho$) is density of the gas in gm/cc; (T) is particle temperature in °C.; and ($K_t$) is thermal conductivity of the particle; and (ii) radiation pressure due to transfer of photon momentum to the particle, determined by the relationship: $F_{rp} = I\pi d^2 Q_{rp}/4c$ where: ($Q_{rp}$) is the fraction of light transferring momentum to the particle; and (c) is the velocity of light.

Figure 2:
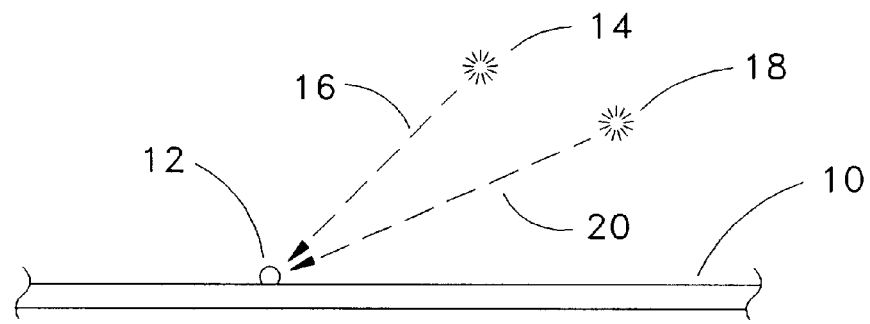
FIG. 2 is similar to FIG. 1, with light directed at the substrate.

FIG. 2 is a schematic representation of a system for detaching and photophoresing particles 12 from the substrate 10. The system includes a "detach" light source 14 directing a light beam 16 at a particle 12 to detach the particle from the substrate 10, and a "photophoresis" light source 18 directing a light beam 20 at the particle 12 to effect photophoresis of the detached particle.

The detach light source 14 is pulsed at or near the resonant frequency of the particle-surface system to impart that frequency to the particle 12, to thereby dislodge and detach the particle from the substrate 10. Pulse frequency of the detach light source 14 is variable so it can be tuned to the resonant frequency of the particle-surface system.

Angles of incidence of one or both light beams on the substrate 10 may be variable between 0° and 90° for coupling efficiency or other purposes.

Figure 3:
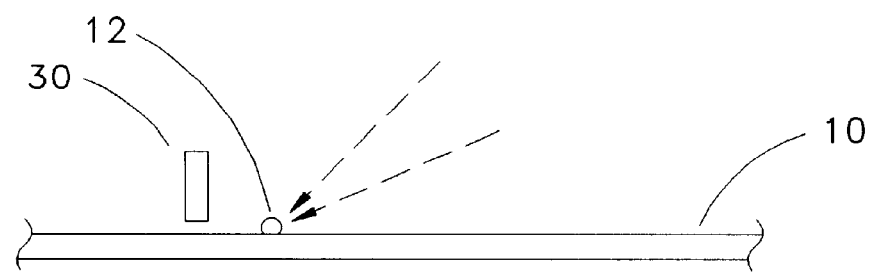
FIG. 3 is similar to FIG. 2, further including a thermal member adjacent to the contaminant particle.

As shown in FIG. 3, a thermal gradient is provided in the vicinity of the particle-substrate system, by an adjacent thermal member 30. Thermal member 30 may be a hot plate to increase particle velocity, or a cold plate to decrease particle velocity. If it is a cold plate, the thermal member 30 is also effective to direct the movement of particles 12 by thermophoresis, such movement being toward the cold member.

Figure 4:
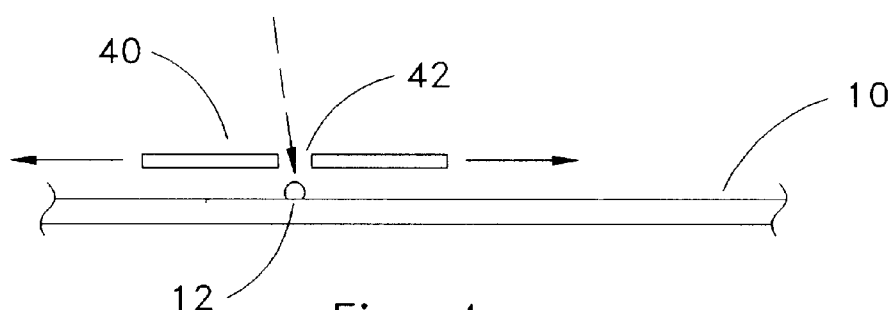
FIG. 4 is similar to FIG. 2, further including a mask.

In FIG. 4 the system further includes a shield 40 over the substrate 10. The shield is movable as indicated by the arrow. Detach light is directed at the surface 10 through an aperture 42 in the shield, ejecting particles 12 up from the surface 10 and through the shield aperture 42 while the shield is in one position. To prevent the particles from returning and reattaching to the surface 10, the shield aperture is moved away from their trajectory and the returning particles land on the shield 40.

The foregoing description of a preferred embodiment of this invention, including any dimensions, angles, or proportions, is intended as illustrative. The concept and scope of the invention are limited only by the following claims and equivalents thereof.

Appendix

Allen, S. D., Lee, S. J., and Imen, K., (1992), Laser cleaning techniques for critical surfaces: Optics and Photonics News, v. 3, p. 28–30.

Ashkin, A. and J. M. Dziedzic, (1971), Optical Levitation by Radiation Pressure, Appl. Phys. Lett., 19, 283.

Ashkin, A., (1980), Applications of Laser Radiation Pressure, Science, Dec. 5, 1980, 1081.

Bedair, S. M. and H. P. Smith (1969), J. Appl. Phys. 40, 4776.

Bocko, P. L. et al. (1990), Chemical Durability and Cleaning of Flat Panel Display Substrate Glasses, in Proceedings of the 1990 SID International Symposium, Las Vega, Nev.

Bowling, R. A. (1985), An Analysis of Particle Adhesion on Semiconductor Surfaces, J. Electrochem. Soc.: Solid-State Sci. and Tech., 132, 9, 2208.

Bowling, R. A. (1994), MMST Wafer Cleaning, Solid State Technol., January, 61.

Dumbaugh, W. H. and P. L. Bocko (1990), Substrate Glasses for Flat-Panel Displays, in Proceedings of the SID, Vol. 31/4, p. 269.

Engelsberg, A. C. (1993a), Particle removal from semiconductor surfaces using a photon-assisted, gas-phase cleaning process, in MRS Proceedings: v. 315.

Engelsberg, A. C. (1993b), Removal of surface contamination using a dry, laser-assisted process, in Microcontamination 93 Conference Proceedings.

Engelsberg, A. C., and Dehais, J. A. (1993c), Reduction of wet chemical and water consumption using the Radiance Process (TM), in Conference Proceedings: SEMI Environmental Conference III.

Hoh, K., et al. (1980) Appl. Phys. Lett. 19, L375.

Iscoff, R. (1993), Wafer Cleaning: Wet Methods Still Lead the Pack, Semiconductor International, July, 58.

Kelley, J. D., and Hovis, F. E., 1993, A thermal detachment mechanism for particle removal from surfaces by pulsed laser irradiation: Microelectronic Engineering, v. 20, p. 159–170.

Lee, S. J., Imen, K., and Allen, S. D. (1993), Laser-assisted particle removal from silicon surfaces: Microelectronic Engineering, v. 20, p. 145–157.

Magee, T. J., and Leung, C. S. (1991), Scanning UV laser removal of contaminants from semiconductor and optical surfaces, in Mittal, K. L., ed., Particles on Surfaces 3: Detection, Adhesion, and Removal: New York, Plenum Press, p. 307–316.

Magee, T. J., Osborne, J. F., Gildea, P., and Leung, C. S. (1988), Laser planarization of nonrefractory metal during integrated circuit fabrication. U.S. Pat. No. 4,758,533, issued 1988.

Menon, V. B., et al. (1989), Effects of Particulate Size, Composition, and Medium on Silicon Wafer Cleaning, Solid State Technol.ogy, March, S7.

Narayan, J. (1979), Appl. Phys. Lett. 34, 312.

Pohlman, A., et al. (1989), Mater. Res. 4, 843.

Periasamy, R., Selvaraj, J., Donovan, R. P., and Nemanich, R. J.(1993), Photophoretic Deflection of Particles in Subatmospheric Pressure Chambers: Techcon'93 SRC, Atlanta, p. 93.

Tam, A. C. et al. (1992), Laser-Cleaning Techniques for Removal of Surface Particulate, J. Appl. Phys. 71, 3515.

Zapka, W., Ziemlich, W., Leung, W. P., and Tam, A. C. (1993), Laser cleaning removes particles from surfaces: Microelectronic Engineering, v. 20, p. 171–183.

U.S. Pat. No. 5,024,968 issued 1991 to Engelsberg

U.S. Pat. No. 5,099,557 issued 1992 to Engelsberg

What is claimed is:

1. A direct exposure system for detachment of contaminant particles from a surface, each said particle forming with said surface a particle-surface system, including the following steps:

directing a detach light at said surface;

pulsing said detach light to excite and vibrate a particle thereon; and tuning the pulse frequency of said detach light to a resonant frequency of the particle-surface system to thereby detach said particle from said surface.

2. A system as defined in claim 1, further including the following step:

varying the angle of incidence of said detach light on said surface to adjust coupling efficiency of said detach light.

3. A system as defined in claim 1, further including the following step:

directing a photophoresis light at said particle to move said particle by photophoresis to thereby prevent reattachment of said particle to said surface.

4. A system as defined in claim 1, further including the following step:

applying a thermal gradient to the area of said particle on said surface to move said particle by thermophoresis to thereby prevent reattachment of said particle to said surface.

5. A direct exposure system for detachment and removal of contaminant particles from a surface, each said particle forming with said surface a particle-surface system, including the following steps:

directing a pulsed detach light at said surface to excite and vibrate a particle thereon;

tuning the pulse frequency of said detach light to a resonant frequency of the particle-surface system to thereby detach said particle from said surface; and directing a photophoresis light at said particle to move said particle by photophoresis to thereby prevent reattachment of said particle to said surface.

6. A system as defined in claim 5, further including the following step:

varying the angle of incidence of said detach light on said surface to adjust coupling efficiency of said detach light.

7. A system as defined in claim 5, further including the following step:

applying a thermal gradient to the area of said particle on said surface to move said particle by thermophoresis to thereby prevent reattachment of said particle to said surface.

* * * * *